United States Patent [19]
Tomita et al.

[11] Patent Number: 6,027,762
[45] Date of Patent: *Feb. 22, 2000

[54] METHOD FOR PRODUCING FLEXIBLE BOARD

[75] Inventors: Tsutomu Tomita; Hironobu Kanesawa; Takaaki Murata; Shingo Naito; Toshiki Hayasaka, all of Ibaraki, Japan

[73] Assignee: Mitsumi Electric Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/652,248

[22] Filed: May 23, 1996

[51] Int. Cl.⁷ .................................................. B05D 5/12
[52] U.S. Cl. ........................ 427/96; 427/98; 427/405; 427/409; 427/123; 427/125
[58] Field of Search ............................. 427/96, 98, 405, 427/409, 123, 125

[56] References Cited

U.S. PATENT DOCUMENTS

| | | | |
|---|---|---|---|
| 3,937,857 | 2/1976 | Brummett et al. | 427/98 |
| 4,194,913 | 3/1980 | Davis | 106/1.22 |
| 4,670,351 | 6/1987 | Keane et al. | |
| 4,959,178 | 9/1990 | Frentzel et al. | 252/514 |
| 5,733,598 | 3/1998 | Sera et al. | 427/96 |

FOREIGN PATENT DOCUMENTS

| | | |
|---|---|---|
| 3515985A1 | 11/1986 | Germany. |
| 2278786 | 11/1990 | Japan. |
| 145189 | 6/1991 | Japan. |
| 3145189 | 6/1991 | Japan. |
| 6120643 | 4/1994 | Japan. |
| 2000197A | 1/1979 | United Kingdom. |

*Primary Examiner*—Brian K. Talbot
*Attorney, Agent, or Firm*—Whitham, Curtis & Whitham

[57] ABSTRACT

A method of producing a flexible board includes printing a circuit pattern on a base film, and providing a plating onto a surface of the circuit pattern.

20 Claims, 5 Drawing Sheets

METHOD FOR PRODUCING FLEXIBLE BOARD

BACKGROUND OF THE INVENTION

1. Field of the Invention

The invention relates to a flexible circuit board which can be used in place of a wire harness in various electronic apparatuses.

2. Related Art

A flexible circuit board provides the following features because of its flexibility, etc. Namely, the flexible circuit board can be set with bending it so that the space in an apparatus is effectively used, thereby increasing the degree of freedom in design; wiring can be placed in a high density and even in a bent portion so as to attain excellent workability in wiring and assembly; and wiring can be placed also in a movable portion so that currents or signals are easily transmitted. As miniaturization of, for example, an audio or video apparatus advances, therefore, a flexible circuit board becomes frequently used in place of a wire harness in such an apparatus.

As shown in FIG. 1, in a flexible board 1000, paste patterns (circuit patterns) 1002 are screen-printed by using thermoset silver paste, copper paste, or the like on one face 1011 of a base film 1001 which is molded from an insulating material such as polyester, or polyimide, and the paste patterns 1002 are dried and cured at a predetermined temperature so as to adhere to the film.

Terminals of plural paste patterns 1002 are exposed in pattern exposed regions 1004 which serve as a terminal area, a chip mounting portion, etc. Resist 1003 is applied to the other portions of the patterns 1002 so as to insulate and protect the patterns. Electronic parts such as resistors and LEDs are mounted on the flexible board, and then the board is used in various electronic apparatuses. Since the base film is flexible, the flexible board can be used in a portion of an electronic apparatus which is bendable or has a curved face.

However, such a conventional art flexible board has problems in that the paste patterns 1002 have a high electric resistance.

In the flexible board, the base film is configured by a film of polyester or the like which is caused by heat to largely shrink or deform and which has a low melting point. Therefore, the circuit patterns must be formed at a low temperature. When thermoset paste is used, a thickness of some extent is required for promoting hardening and reaction. This causes the whole of the flexible board to be increased in thickness with the result that the flexible board cannot sufficiently exert its flexibility, thereby lowering the flexing properties.

When silver paste is used, particularly, there occurs a phenomenon that variation with time or the like of the paste causes migration in the pattern exposed regions 1004 so that adjacent patterns are short-circuited with each other. In order to prevent such a phenomenon from occurring, countermeasures such as that carbon is printed on each pattern in an exposed region or that carbon is mixed with the silver paste are taken. However, these countermeasures cannot sufficiently satisfy the request for reducing the pattern pitch.

Namely, when migration occurs, a short circuit (a phenomenon in which patterns contact with each other) may be caused. Even when such a short circuit is not caused, the insulation resistance between patterns is lowered so that the withstand voltage is lowered, with the result that another short circuit phenomenon (a phenomenon in which an electric discharge occurs) is easily produced at a low voltage.

In the conventional art, as a countermeasure for migration, known are a method in which patterns are covered by carbon printing, and that in which patterns are formed by silver-carbon mixed paste. According to the latter method, migration cannot be perfectly prevented from occurring because silver is exposed.

The former method is known as a countermeasure which can prevent migration to a certain extent from occurring. However, printing must be conducted so that carbon covers a pattern. In printing, therefore, deviation between a pattern and carbon may occur. In the case where the pattern pitch is large (a pitch of about 1 mm) and the pattern width can be set with room, there arises no serious problem. By contrast, in the case where the pattern pitch is small (a pitch of 0.5 mm or less) and the pattern width cannot be set with room, the possibility that print deviation causes adjacent patterns to contact with each other is increased.

SUMMARY OF THE INVENTION

It is an object of the invention to provide a flexible board in which a conductor has a reduced electric resistance.

It is another object of the invention to provide a flexible board in which a circuit pattern has improved adhesion properties with respect to a base film and which has improved flexing properties.

It is a further object of the invention to provide a flexible board in which adhesion properties of a circuit pattern are prevented from being impaired and flexing properties are improved.

It is a still further object of the invention to provide a flexible board in which a pattern exposed region can be formed in a reduced number of production steps and by a small number of kinds of materials.

It is a still further object of the invention to provide a flexible board which can be reduced in thickness as a whole so that its flexibility is improved.

It is a still further object of the present invention, even when the pattern pitch is small, it is possible to cover patterns as far as the patterns can be printed, thereby preventing migration from occurring.

The invention is proposed in order to attain the objects. According to the invention, a flexible board is provided in which a circuit pattern is formed on a base film by screen printing, and gold plating or solder plating is formed on the surface of the circuit pattern via plating.

In order to attain the objects, according to the invention, a flexible circuit board is provided in which a silver paste pattern is printed on one face of a film substrate, plating of a metal conductor pattern is formed on the silver paste pattern, and a resist is printed on the conductor pattern except a pattern exposed region and also on the film substrate, wherein the conductor pattern is formed by solder plating or the like, and the pattern exposed region in an end portion of the conductor pattern is formed by exposing the solder plating as it is.

In order to attain the objects, according to the invention, a flexible circuit board is provided in which a silver or copper paste pattern is printed on one face of a film substrate in the longitudinal direction, plating of a metal conductor pattern is formed on the paste pattern, and resist is printed on the conductor pattern except a pattern exposed region and also on the film substrate, wherein the conductor pattern is formed by gold plating, and the pattern exposed region is formed by exposing the gold plating as it is in an end portion of the conductor pattern.

In order to attain the objects, according to the invention, a configuration is provided in which a pattern of UV-curing silver paste is printed on one face of a film substrate and cured by ultraviolet curing into a thin shape, a conductor pattern is formed on the silver paste pattern by metal plating, and a resist is printed on the conductor pattern and the film substrate.

According to the present invention, plating directly covers the circuit pattern so as to reduce a conductive resistance.

Plating which directly covers the circuit pattern produces internal stress of a reduced degree and has excellent ductility. Therefore, the plating does not impair the adhesion strength of the circuit pattern and exhibits high resistance to bending operations.

Furthermore, since the plating is covered by gold plating, solder plating or the like, excellent electrical conduction is maintained.

As seen from the above description, according to the invention, since the conductor pattern is formed by solder plating and the pattern exposed region is formed by exposing the solder plating as it is in an end portion of the conductor pattern, the process of plating the pattern exposed region after the printing of the resist so as to prevent corrosion from occurring can be eliminated. This can reduce the number of production steps and that of the kinds of materials. Since the conductor pattern is configured by solder plating, the production cost of the flexible circuit board can be reduced.

According to the invention, since the conductor pattern is formed by gold plating and the pattern exposed region is formed by exposing the gold plating as it is in an end portion of the conductor pattern, the process of plating the pattern exposed region after the printing of the resist so as to prevent corrosion from occurring can be eliminated. This can reduce the number of production steps and that of the kinds of materials. Since the conductor pattern is configured by gold plating, the resistance of the circuit can be reduced so that the performance and reliability of the flexible circuit board are improved.

According to the invention, since a pattern of UV-curing silver paste is printed on one face of a film substrate and cured by ultraviolet curing into a thin shape, the whole of a flexible circuit board is reduced in thickness so as to exhibit excellent flexibility. Since a pattern of UV-curing silver paste is used, thermal damage which may be caused in the board, etc. during a drying process can be reduced, and the time period for the drying process can be shortened.

DETAILED DESCRIPTION OF THE PREFERRED EMBODIMENTS

First Embodiment

Figure 1:
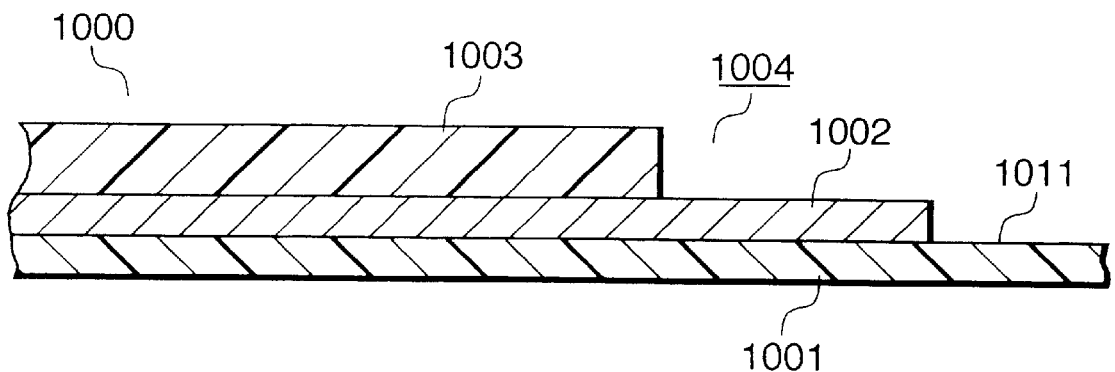
FIG. 1 is an enlarged section view of a conventional art example.
Figure 2:
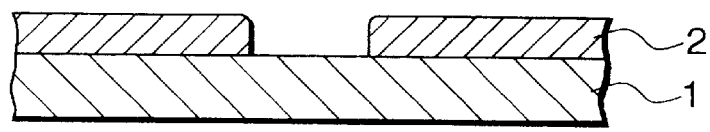
FIG. 2 is a section view of an embodiment of the invention which has been subjected to a step of forming circuit patterns.

Hereinafter, a first embodiment of the invention will be described in detail with reference to the accompanying drawings. In FIG. 2, 1 designates a base film which is made of an insulating material having flexibility, such as polyester, or polyimide. Silver paste or copper paste is applied to the base film 1 by screen-printing such as a mesh screen has patterns formed on the bases of a predetermined circuit design, thereby forming circuit patterns 2.

Figure 3:
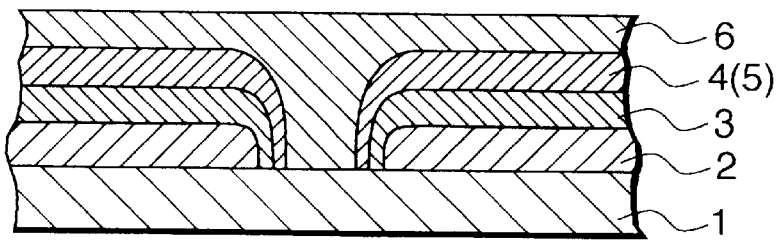
FIG. 3 is a section view showing the flexible board in the completed state.

As a pretreatment of the surface treatment, acid degreasing or alkaline degreasing is conducted in order to remove scales, grease, etc. which may adhere to the surfaces of the circuit patterns 2, and then water washing is done. The object of the water washing is to prevent the solvent used in the pretreatment from contaminating a solvent which is used in the next step. The surfaces of the circuit patterns 2 are activated by 10% sulfuric acid so that the surface treatment is easily conducted, and water washing is further done. Thereafter, the board is immersed in a copper sulfate plating bath containing copper sulfate and sulfuric acid, thereby forming copper sulfate plating 3 on the circuit patterns 2 as shown in FIG. 3. The board is then washed in water. Thereafter, gold plating 4 or solder plating 5 is formed on the copper sulfate plating 3. The board is further washed in water and then dried. The entire face is covered by resist 6 so that the flexible board is protected from the external environment and electrically insulated.

Internal stress produced in copper sulfate plating is smaller than that produced in copper cyanide plating or nickel plating and has a value of 1.0 kg/mm$^2$ or less. When plating is caused to shrink by internal stress, there occur phenomena such as separation of a circuit pattern or formation of cracks. As internal stress of plating is smaller, therefore, adhesion properties of a circuit pattern are less impaired. Furthermore, copper sulfate plating has excellent ductility.

The inventor conducted tests on adhesion properties and flexing properties with using flexible boards on which three kinds of plating, i.e., copper sulfate plating, copper cyanide plating, and electroless copper plating are formed. Adhesion properties were tested in the following manner. An adhesive tape was applied to the surface of each flexible board. When the adhesive tape was peeled off, it was checked whether or not the plating and the circuit pattern remained to adhere to the adhesive tape and was separated from the base film. As a result, separation occurred in the boards of copper cyanide plating and electroless copper plating, and did not occur in the board of copper sulfate plating.

Figure 4A:
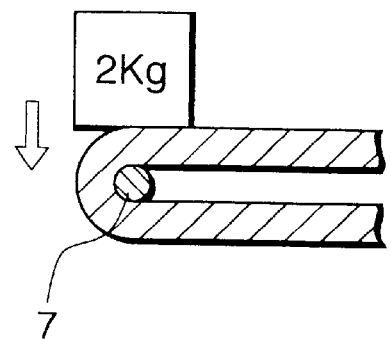
FIGS. 4(a) and (b) are diagrams illustrating a method of testing flexing properties of copper sulfate.
Figure 4B:
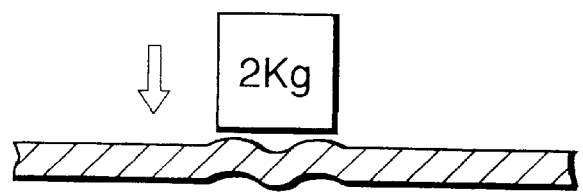

The tests on flexing properties were conducted in the following manner. As shown in FIG. 4(a), a flexible board was folded in two with placing a wire 7 of a diameter of 0.7 mm therebetween. A load of 2 kg was vertically applied to the fold. As shown in FIG. 4(b), thereafter, the flexible board was expanded and the wire 7 was removed. The load of 2 kg was again applied to the fold so as to stretch the fold. A resistance between the right and left circuit patterns via the fold was measured. The steps of holding, expanding, and resistance measurement were repeated, and the number of cycles of the steps was checked which were required to be repeated until the resistance was increased by 30% with respect to the original resistance of the circuit patterns obtained before the initial folding step. As a result, in the boards of copper cyanide plating and electroless copper plating, it was confirmed that, after one cycle of the steps of holding and expanding was conducted, the resistance was increased by 30% or more and a breakage of any kind occurred in the circuit patterns. By contrast, in the board of copper sulfate plating, the increase in resistance did not exceed 30% even when ten cycles of the steps were conducted. In this way, it turned out that, when a circuit pattern is covered by copper sulfate plating, the adhesion strength is not lowered and flexing properties are improved. As described above, good electrical conduction is maintained by forming the gold plating 4 or the solder plating 5, and excellent adhesion properties and flexing properties are attained by interposing the copper sulfate plating 3 between the gold plating 4 or the solder plating 5 and the circuit patterns 2 as described above.

Second Embodiment

Hereinafter, a second embodiment of the invention will be described in detail with reference to the accompanying drawings.

Figure 5:
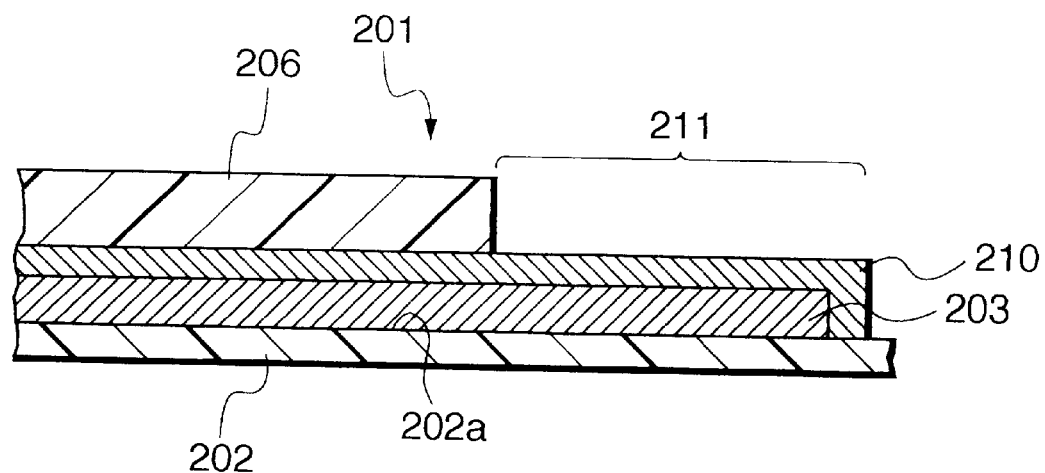
FIG. 5 is an enlarged section view of a flexible circuit board which is a second embodiment of the invention.

FIG. 5 is an enlarged section view of a flexible circuit board according to the invention. The flexible circuit board 201 comprises a strip-like film substrate 202 which is made of a soft and thin material such as polyester. An electrically conductive foundation, silver paste patterns 203 are formed by screen-printing on one face 202a of the film substrate 202.

Metal conductor patterns are formed on the paste patterns 203 by means of electroplating. Solder is hardly corroded by air and has the most excellent solderability. When solder plating is employed in this case, therefore, a countermeasure for preventing the pattern exposed region from being corroded is not required to be taken. Consequently, solder plating is preferable. Furthermore, solder is an alloy containing tin and lead as main components and inexpensive, and has excellent flexing properties. Consequently, solder plating is advantageously used in the flexible circuit board 201.

When the film substrate 202 is immersed in a solder plating bath so as to be subjected to electroplating, a metal thin film made of solder is firmly formed on the paste patterns 203 via the silver foundation metal, so that solder plating is satisfactorily conducted. As a result, conductor patterns 210 having excellent electrical properties and a thin film shape are formed in a high density by solder plating, on one face of the film substrate 202.

Thereafter, soft ink resist 206 is applied by printing to the portion of the conductor patterns 210 except pattern exposed regions 211 at end portions of the conductor patterns and also to the film substrate 202, thereby insulating and protecting the conductor patterns 210. The pattern exposed regions 211 which serve as a terminal area, a chip mounting portion, etc. are formed by exposing the solder plating of the conductor patterns 210 as it is. Because of the properties of the solder plating, the patterns hardly are corroded and excellent solderability is ensured.

In the thus configured flexible circuit board 201, the conductor patterns 210 made of solder plating are sandwiched in the insulated state between the strip-like film substrate 202 which is soft and thin and the soft resist 206. When the resist 206 is bent together with the film substrate 202, therefore, the solder-plated conductor patterns 210 also can be freely bent without being broken.

When the flexible circuit board 201 is to be used in various apparatuses, the flexible circuit board 201 can be disposed while arbitrarily bending the conductor patterns 210 together with the film substrate 202 and the resist 206, so that the space in an apparatus is effectively used and the flexible circuit board extends over a fixed part and a movable part. The ends of the conductor patterns 210 are subjected to soldering connection in the most satisfactorily manner through the solder pattern exposed regions 211, or also wires of parts such as chips are soldered so as to be mounted. In this way, the flexible circuit board 201 is wired in a high density in place of a wire harness and currents and signals are satisfactorily transmitted in a high density via the solder-plated conductor patterns 210.

Third Embodiment

A third embodiment will be described. In the following description, only a configuration which is different from the second embodiment will be described. In the third embodiment, gold plating is used in place of solder plating. Also the embodiment can attain the same effects as those of the second embodiment.

Fourth Embodiment

Figure 6:
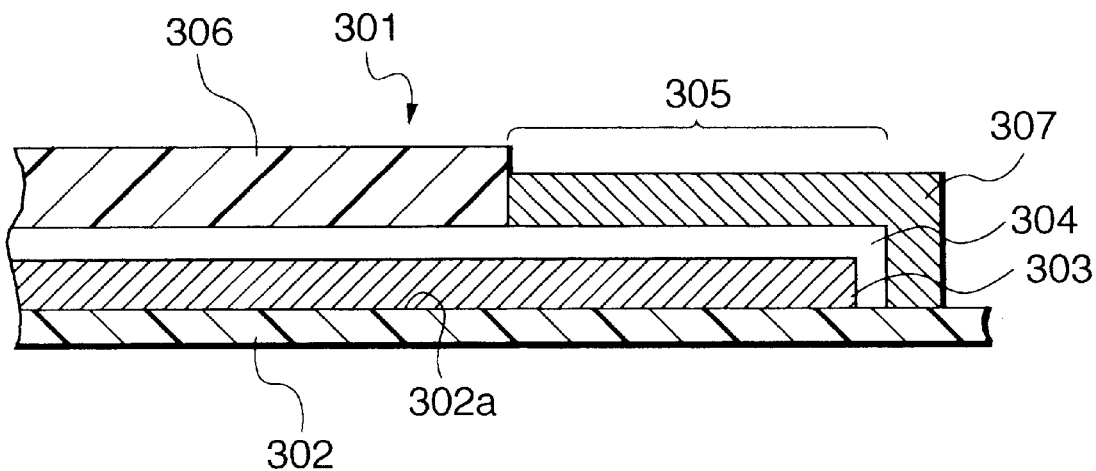
FIG. 6 is an enlarged section view of a fourth embodiment.

In the following description, only a configuration which is different from the second embodiment will be described. In the fourth embodiment, as shown in FIG. 6, conductor patterns 304 are formed by means of copper electroplating on paste patterns 303 formed by screen-printing, respectively.

As a result, the conductor patterns 304 which are made of copper plating and inexpensive and have excellent electrical properties are formed in a high density and into a thin film shape, on one face of a film substrate 302. Ends of plural conductor patterns 304 are formed as a pattern exposed region 305 which serves as a terminal area, a chip mounting portion, etc. Soft ink resist 306 is applied by printing to the portions of the conductor patterns 304 except the pattern exposed region so as to insulate and protect the patterns.

Since the pattern exposed region 305 is always exposed to the outside so as to contact with air, the region is required to have corrosion-resistant properties. Since parts such as chip parts are soldered to the pattern exposed region, the region is required also to have excellent solderability. When the copper plating of the conductor patterns 304 is exposed as it is, the copper plating is oxidized and corroded by air so that its solderability is impaired. To comply with this, after the resist is printed, a conductor film 307 is formed on the copper plating of the pattern exposed region 305 by solder plating or gold plating, thereby preventing the pattern exposed region from being corroded and ensuring solderability.

Fifth Embodiment

Hereinafter, a fifth embodiment of the invention will be described in detail with reference to the accompanying drawings.

Figure 7:
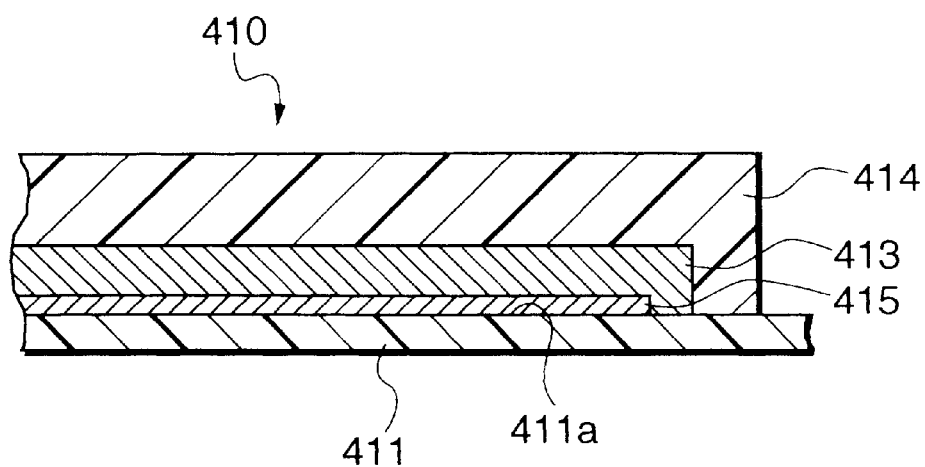
FIG. 7 is an enlarged section view of a flexible board which is a fifth embodiment of the invention.

FIG. 7 is an enlarged section view of a flexible board according to the invention. The flexible board 410 comprises a film substrate 411 which is made of a soft and thin material such as polyester. An electrically conductive foundation, silver paste patterns are printed on a wide range of one face 411a of the film substrate 411. When the patterns are made of UV-curing silver paste, the patterns can be made thinner than those of thermoset paste used in the conventional art.

Consequently, UV-curing silver paste patterns 415 are thinly applied by printing to the film substrate 411, and the silver paste patterns 415 are irradiated with UV rays. This causes the silver paste patterns 415 to be dried and cured within a short time period without producing thermal damage, with the result that the silver paste patterns adhere to the film substrate 411.

When the film substrate 411 is then immersed in a plating bath of copper or the like so as to be subjected to electroplating, therefore, a metal thin film made of copper is firmly formed on the paste patterns 415 via the silver foundation metal, or copper plating is satisfactorily conducted. As a result, conductor patterns 413 having excellent electrical properties and a thin film shape are formed by copper plating in a high density, on one face of the film substrate 411. Soft ink resist 414 is applied by printing onto the conductor patterns 413 and the film substrate 411 so that the copper-plated conductor patterns 413 are protected while electrically insulating the patterns from each other.

In the thus configured flexible board 410, the silver paste patterns 415 which are thinner than patterns in the conventional art, the copper-plated conductor patterns 413, and the resist 414 are closely laminated in sequence on the soft and thin film substrate 411. Hence, the whole of the flexible board 410 can be reduced in thickness while ensuring excellent electrical properties. Therefore, the flexible board 410 can perform the function as a circuit board through which currents and signals can be satisfactorily transmitted, by means of the copper-plated conductor patterns 413, and can bend easily and responsively in response to an external pressure because of the flexibility of the film substrate 411.

Figure 9:
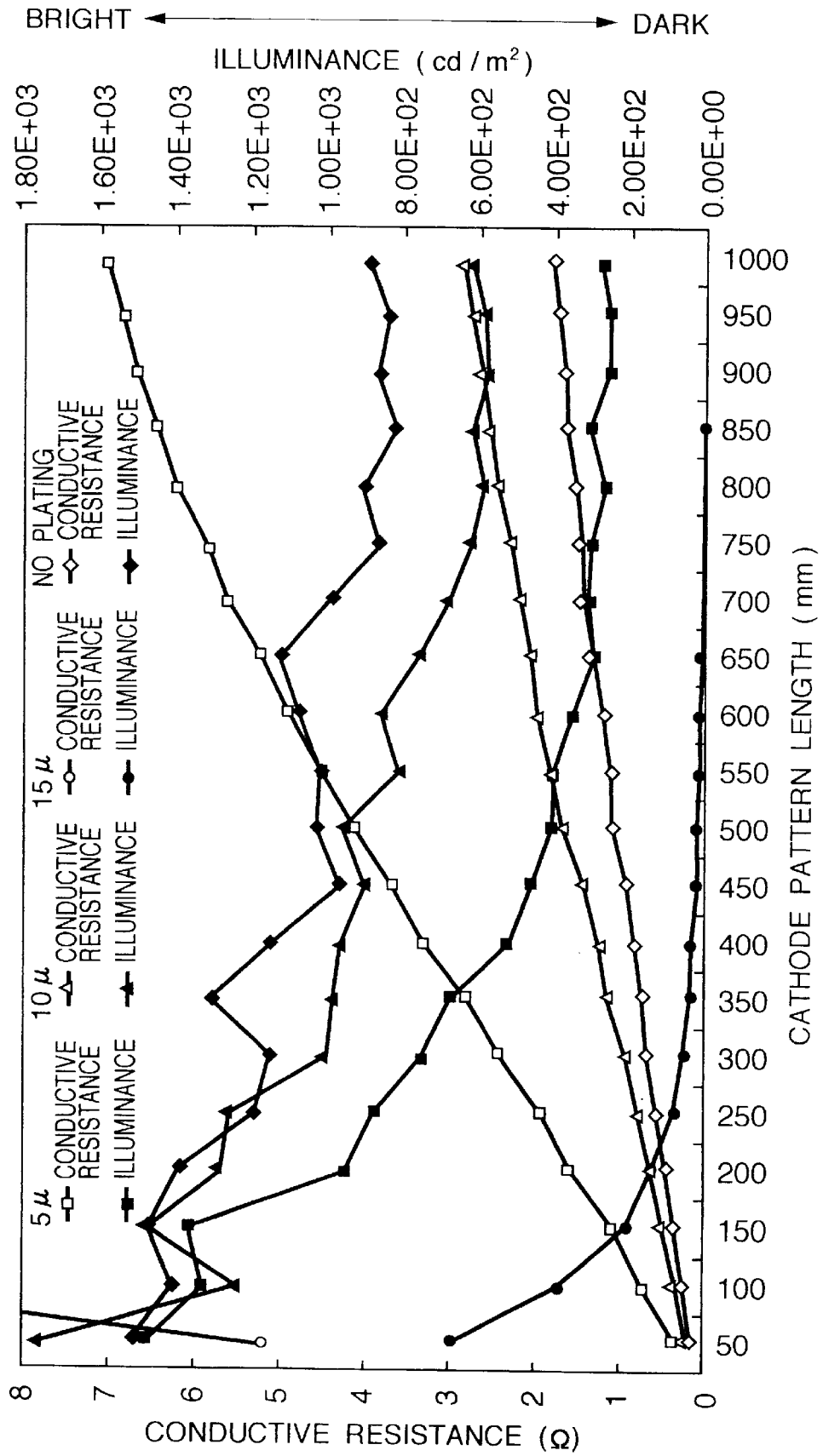
FIG. 9 is a graph of measurements of the resistance of a conductor of a flexible circuit board, and the luminance of an LED of the flexible circuit board.

Table 1 and FIG. 9 show measurement results of the resistance of a conductor of a flexible circuit board, and the luminance of an LED of the flexible circuit board.

Figure 8:
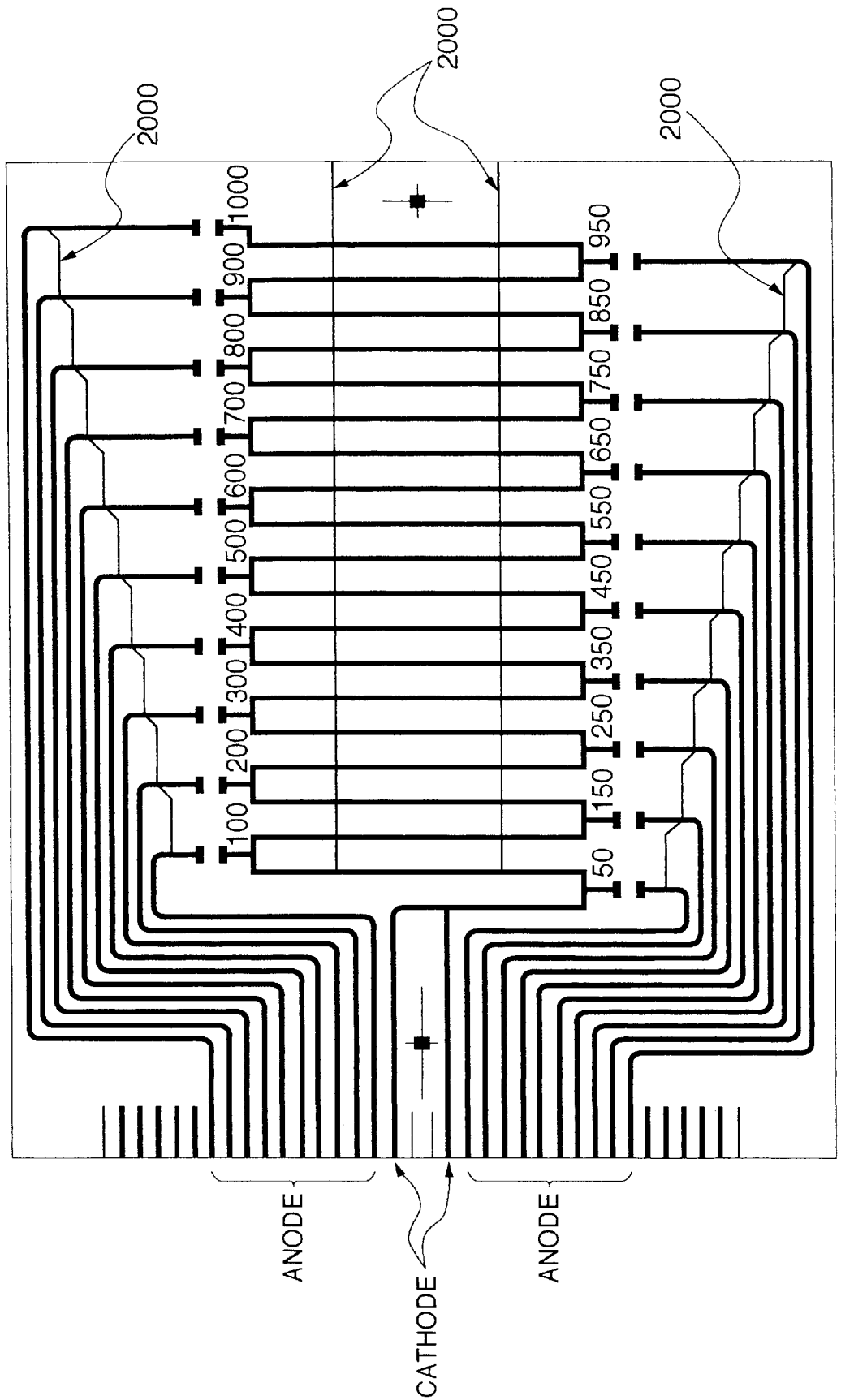
FIG. 8 is shows a test pattern of the present invention relating the resistance of a pattern and the luminance of each LED.

As shown in FIG. 8, cathode patterns having a length of 1 m and a width of 1 mm are formed by plating so as to have a thickness of 5 $\mu$m, 10 $\mu$m, and 15 $\mu$m, respectively. Twenty LEDs (CL-150VG) are mounted in parallel and at intervals of 50 mm by a conductive adhesive agent on the cathode patterns. Then, the resistances of the patterns are measured at each increment of 50 mm and the luminance of each LED is measured while lighting the LED by applying a potential difference of 2 V across the anode and the cathode. A preferred luminance meter is TOPCON BM-7 (AE1053).

In FIG. 8, the numerals shown in the LED mounting portions indicate the lengths of the cathode pattern portions elongating to the respective LED mounting portions, respectively (the width is 1 mm). The power supply patterns 2000 are cut away after plating.

According to Table 1 and FIG. 9, the flexible circuit board of the present invention reduces the conductive resistance of circuit pattern. In other words, excellent electrical conduction is maintained.

TABLE 1

| Cathode pattern length (mm) | plating thickness 5 $\mu$ | | plating thickness 10 $\mu$ | | plating thickness 15 $\mu$ | | No plating | |
|---|---|---|---|---|---|---|---|---|
| | Conductive resistance ($\Omega$) | illuminance (cd/m$^2$) | Conductive resistance ($\Omega$) | illuminance (cd/m$^2$) | Conductive resistance ($\Omega$) | illuminance (cd/m$^2$) | Conductive resistance ($\Omega$) | illuminance (cd/m$^2$) |
| 50 | 0.28 | 1.48E + 03 | 0.15 | 1.77E + 03 | 0.11 | 1.51E + 03 | 5.13 | 6.66E + 02 |
| 100 | 0.71 | 1.32E + 03 | 0.31 | 1.24E + 03 | 0.21 | 1.40E + 03 | 10.46 | 3.91E + 02 |
| 150 | 1.07 | 1.36E + 03 | 0.46 | 1.46E + 03 | 0.31 | 1.47E + 03 | 15.93 | 2.00E + 02 |
| 200 | 1.53 | 9.45E + 02 | 0.65 | 1.28E + 03 | 0.42 | 1.39E + 03 | 21.97 | 1.36E + 02 |
| 250 | 1.91 | 8.72E + 02 | 0.78 | 1.26E + 03 | 0.55 | 1.19E + 03 | 27.15 | 7.50E + 02 |
| 300 | 2.38 | 7.44E + 02 | 0.95 | 1.00E + 03 | 0.65 | 1.14E + 03 | 32.93 | 5.18E + 02 |
| 350 | 2.78 | 6.69E + 02 | 1.16 | 9.78E + 02 | 0.72 | 1.31E + 03 | 38.52 | 3.20E + 01 |
| 400 | 3.26 | 5.14E + 02 | 1.28 | 9.54E + 02 | 0.82 | 1.15E + 03 | 44.37 | 2.87E + 01 |
| 450 | 3.65 | 4.62E + 02 | 1.45 | 8.98E + 02 | 0.93 | 9.56E + 02 | 50.05 | 1.54E + 01 |
| 500 | 4.09 | 4.01E + 02 | 1.70 | 9.56E + 02 | 1.08 | 1.02E + 03 | 56.17 | 1.32E + 01 |
| 550 | 4.48 | 3.93E + 02 | 1.80 | 8.04E + 02 | 1.12 | 1.02E + 03 | 62.03 | 1.10E + 01 |
| 600 | 4.88 | 3.54E + 02 | 1.98 | 8.57E + 02 | 1.21 | 1.07E + 03 | 67.94 | 8.20E + 01 |
| 650 | 5.23 | 2.99E + 02 | 2.06 | 7.62E + 02 | 1.31 | 1.12E + 03 | 73.91 | 6.62E + 00 |
| 700 | 5.61 | 3.13E + 02 | 2.20 | 6.73E + 02 | 1.44 | 9.91E + 02 | 79.88 | Impossible |
| 750 | 5.86 | 3.06E + 02 | 2.30 | 6.24E + 02 | 1.47 | 8.56E + 02 | 85.37 | Impossible |
| 800 | 6.23 | 2.68E + 02 | 2.44 | 5.89E + 02 | 1.53 | 9.02E + 02 | 91.31 | Impossible |
| 850 | 6.44 | 3.10E + 02 | 2.54 | 6.21E + 02 | 1.62 | 8.10E + 02 | 97.32 | Impossible |
| 900 | 6.69 | 2.60E + 02 | 2.64 | 5.78E + 02 | 1.67 | 8.58E + 02 | 103.53 | Impossible |
| 950 | 6.87 | 2.54E + 02 | 2.75 | 5.89E + 02 | 1.75 | 8.31E + 02 | 109.61 | Impossible |
| 1000 | 7.03 | 2.79E + 02 | 2.86 | 6.19E + 02 | 1.80 | 8.83E + 02 | 115.85 | Impossible |

In the above, the configuration using the copper sulfate plating has been described as an embodiment. The invention is not restricted to this and can be applied to a board using any kind of plating as far as the plating produces small internal stress.

As described in detail in the embodiments, according to the invention, since the circuit pattern formed on screen-printing is covered by copper sulfate plating, the separation of the circuit pattern due to internal stress of a surface treatment agent is prevented from occurring and the flexing properties are improved. The invention can attain further various effects. For example, excellent electrical conduction can be maintained by forming gold plating or solder plating on the copper sulfate plating.

As seen from the above description, according to the invention, a conductor pattern is formed by solder plating, gold plating, or the like, and a pattern exposed region is formed in an end portion of the conductor pattern by exposing the solder plating or the like as it is. Therefore, the process of plating the pattern exposed region after the printing of the resist so as to prevent corrosion from occurring can be eliminated. This can reduce the number of production steps and that of the kinds of materials. Since the conductor pattern is configured by solder plating, the production cost of the flexible circuit board can be reduced. Furthermore, the pattern pitch can be reduced.

As seen from the above description, according to the invention, since a pattern of UV-curing silver paste is printed on one face of a film substrate and cured by ultraviolet curing into a thin shape, the whole of a flexible board is reduced in thickness so as to exhibit excellent flexibility. Since a pattern of UV-curing silver paste is used, thermal damage which may be caused in the board, etc. during a drying process can be reduced, and the time period for the drying process can be shortened.

The invention may be variously modified without departing from the spirit of the invention. It is a matter of course that such modifications are within the scope of the invention.

What is claimed is:

1. A method for producing a flexible circuit board comprising steps of:
   printing a circuit pattern on a flexible base film;
   providing a plating onto a surface of said circuit pattern, said plating including copper formed from a copper sulfate and sulfuric acid solution, thereby resulting in said copper plating having an internal stress of 1.0 kg/mm$^2$ or less; and
   forming a resist layer onto said base film and said plating except for a pattern exposed region,
   wherein said copper plating is between said resist layer and said circuit pattern such that tensile and compressive stresses in said copper plating are reduced to 1.0 kg/mm$^2$ or less.

2. A method for producing a flexible board as claimed in claim 1, further comprising:
   providing a plating onto a surface of the circuit pattern of the pattern exposed region.

3. A method for producing a flexible circuit board as claimed in claim 1 further comprising a second plating of gold.

4. A method for producing a flexible circuit board as claimed in claim 1 further comprising a second plating of solder in sulfuric acid.

5. A method for producing a flexible board as claimed in claim 1, wherein the said step of providing a plating comprises a step of providing a plating directly onto said surface of the circuit pattern.

6. A method for producing a flexible board as claimed in claim 1, further comprising steps of:
   after said printing of the circuit pattern, at least one of acid degreasing and alkaline degreasing of the circuit patterns;
   washing the circuit patterns with water;
   activating a surface of the circuit pattern with 10% sulfuric acid;
   and washing an activated surface of the circuit pattern with water.

7. A method for producing a flexible board as claimed in claim 1, further comprising:
   providing a second plating onto a surface of the plating.

8. A method for producing a flexible board as claimed in claim 7, wherein the second plating includes gold plating.

9. A method for producing a flexible board as claimed in claim 7, wherein the second plating includes solder plating.

10. A method for producing a flexible board as claimed in claim 1, wherein said step of providing a plating comprises immersing said board in a copper sulfate plate bath containing said copper sulfate metal and sulfuric acid; and
    washing said board with water.

11. A method for producing a flexible board as claimed in claim 10, further comprising forming one of gold plating and solder plating on said copper sulfate metal;
    washing said board with water; and
    drying said board.

12. A method for producing a flexible board as claimed in claim 11, further comprising a step of covering an entire surface of said board with a resist so as to protect said board from an external environment and to electrically insulate said board,
    wherein said base film comprises polyester and said resist comprises a soft ink resist, wherein the circuit pattern comprises a conductor pattern formed by copper electroplating on paste patterns formed by screen-printing, and
    wherein after said resist is printed, a conductor film is formed on said copper plating of said pattern exposed region by one of solder plating and gold plating, thereby preventing said pattern exposed region from being corroded.

13. A method for producing a flexible board as claimed in claim 1, wherein the step of printing the circuit pattern includes:
    applying metal pastes onto the base film through a mesh screen on the basis of a predetermined circuit design to form the circuit pattern.

14. A method for producing a flexible board as claimed in claim 3, wherein the metal pastes include at least one of silver and copper pastes.

15. A method for producing a flexible board as claimed in claim 3, wherein the metal pastes include Ultraviolet curing pastes.

16. A method for producing a flexible board as claimed in claim 11, further comprising:
    applying Ultraviolet rays onto Ultraviolet curing pastes to form the circuit pattern.

17. A method for producing a flexible circuit board comprising steps of:
    printing a circuit pattern on a base film;
    providing a plating onto a surface of the circuit pattern; and
    forming a resist layer onto said base film except for a pattern exposed region,
    wherein said plating includes a first plating formed from a copper sulfate and sulfuric acid solution and having an internal stress of 1.0 kg/mm$^2$ or less and a second plating of gold.

18. A method for producing a flexible board as claimed in claim 5, wherein the said step of providing a plating comprises a step of providing a plating directly onto said surface of the circuit pattern.

19. A method for producing a flexible circuit board comprising steps of:
    printing a circuit pattern on a base film;
    providing a plating onto a surface of the circuit pattern; and
    forming a resist layer onto said base film except for a pattern exposed region,
    wherein said plating includes a first plating formed from a copper sulfate and sulfuric acid solution and having an internal stress of 1.0 kg/mm$^2$ or less and a second plating of solder.

20. A method for producing a flexible board as claimed in claim 6, wherein the said step of providing a plating comprises a step of providing a plating directly onto said surface of the circuit pattern.

* * * * *